(12) United States Patent
Sandner

(10) Patent No.: US 7,187,246 B2
(45) Date of Patent: Mar. 6, 2007

(54) OSCILLATOR CIRCUIT

(75) Inventor: Christoph Sandner, Villach (AT)

(73) Assignee: Infineon Technologies AG, Munich (DE)

( * ) Notice: Subject to any disclaimer, the term of this patent is extended or adjusted under 35 U.S.C. 154(b) by 261 days.

(21) Appl. No.: 10/379,472

(22) Filed: Mar. 4, 2003

(65) Prior Publication Data
US 2003/0174024 A1    Sep. 18, 2003

(30) Foreign Application Priority Data
Mar. 6, 2002 (DE) .................. 102 09 867

(51) Int. Cl.
*H03L 1/00* (2006.01)
(52) U.S. Cl. .................. 331/175; 331/117 R; 331/167; 331/177 V; 331/36 C; 331/108 C
(58) Field of Classification Search ............ 331/177 V, 331/117 R, 117 FE, 185, 108 C, 36 C, 175, 331/167
See application file for complete search history.

(56) References Cited

U.S. PATENT DOCUMENTS

| | | | |
|---|---|---|---|
| 4,588,968 A * | 5/1986 | Wile | 331/109 |
| 4,635,296 A * | 1/1987 | Dinsmore | 455/113 |
| 5,151,667 A * | 9/1992 | Nishijima | 331/117 R |
| 5,604,466 A | 2/1997 | Dreps et al. | 331/113 |
| 5,914,513 A * | 6/1999 | Shenai et al. | 257/312 |
| 6,281,758 B1 | 8/2001 | Elsayed et al. | 331/16 |
| 6,667,506 B1 * | 12/2003 | Reedy et al. | 257/314 |
| 6,731,182 B2 * | 5/2004 | Sakurai | 331/177 V |

OTHER PUBLICATIONS

Rauscharmer UKW-Oszillator mit Diodenabstimmung, digitaler Frequenzratung und Frequenzanzeige, by Michael Marton, UKW-Berichte 4, pp. 194-209. 1980 (w/ translated abstract).

* cited by examiner

*Primary Examiner*—Arnold Kinkead
(74) *Attorney, Agent, or Firm*—Peter F. Corless; William J. Daley, Jr.; Edwards Angell Palmer & Dodge

(57) ABSTRACT

In the case of a voltage-controlled LC oscillator (4), the effects of supply voltage fluctuations are reduced according to the invention, due to the fact that a stabilized voltage source (3) is assigned to the LC oscillator (4), which supplies the LC oscillator (4) with a stabilized voltage. This in particular is the case if the LC oscillator (4) is integrated together with other circuit components in a semiconductor and heavy noise or strong disturbances occur on supply voltage lines (1, 2). Advantageously, the stabilized voltage source (3) is formed by an operational amplifier (6), after which a driver transistor (5) is positioned, whereby the operational amplifier is subjected to a reference voltage (7).

27 Claims, 1 Drawing Sheet

OSCILLATOR CIRCUIT

FIELD OF THE INVENTION

The present invention relates to an oscillator circuit with a voltage-controlled oscillator, which comprises at least a controllable capacitor as frequency-affecting element and at least one inductor assigned to the controllable capacitor.

BACKGROUND OF THE INVENTION

An oscillator circuit of this kind is known, for example, from U.S. Pat. No. 6,281,758, in which an LC oscillator with two varactors is described. In this case, the LC oscillator is fed with a constant current which is supplied by a constant current source formed by a current mirror. Despite the constant current source, the frequency of the LC oscillator is strongly affected by the noise, which is produced in particular in the case of an integrated circuit by surrounding circuit components. In order to reduce the sensitivity of the LC oscillator to noise, the oscillator described in U.S. Pat. No. 6,281,758 is designed differentially. Disadvantageously, this means high cost of the circuit and a restriction in the circuit options, which may be used in the construction of an LC oscillator.

SUMMARY OF THE INVENTION

It is the object of the present invention to provide an oscillator circuit with an LC oscillator of the kind described initially, whereby high insensitivity to noise is achieved at low cost.

This object is achieved according to the invention by an oscillator circuit with the features of claim 1. The dependent claims in each case define preferred and advantageous embodiments of the present invention.

The voltage-controlled LC oscillator according to the invention is supplied by a stabilized voltage source. Advantageously, the stabilized voltage source is positioned in close proximity to the LC oscillator. By utilizing the stabilized voltage source, the supply voltage to the LC oscillator is decoupled from the circuit environment, so that disturbances in the supply voltage due, for example, to surrounding circuit components cannot affect the frequency of the LC oscillator.

This is particularly advantageous if the LC oscillator together with other circuit components is integrated in a semiconductor device. The stabilized voltage source can, for example, be formed by a driver with a low impedance output, which supplies the stabilized voltage to feed the voltage-controlled oscillator, whereby a constant reference voltage is applied to an input of the driver. Advantageously, the input of the driver has a high impedance, so that the reference voltage can be provided at low cost with no or only slight fluctuations. For this purpose, RC elements, for example, can be used, which are connected as low-pass filters, whereby due to the high impedance input of the driver a low cut-off frequency can be achieved even with small capacitances. Advantageously, the driver is formed by an operational amplifier, which as a rule has a very high input impedance. In an advantageous refinement, a simple power amplifier can be positioned downstream of an operational amplifier as driver, in order to increase the load rating of the stabilized voltage source. The power amplifier, for example, can be a transistor or a field-effect transistor.

In an advantageous refinement of the present invention, the voltage-controlled oscillator further comprises a constant current source to produce a constant current flowing through the voltage-controlled oscillator. In this way, the effects of fluctuations in the operating voltage on the frequency of the LC oscillator can be further reduced. The constant current source can be formed, for example, by a current mirror from two transistors, which advantageously are field-effect transistors. For this purpose, one current path of the current mirror is subjected to a reference current, so that the current mirror produces a constant current corresponding to the reference current in a second current path.

Advantageously, the LC oscillator and the LC oscillator with a constant current source positioned upstream thereof, respectively, are directly subjected to a stabilized voltage from the stabilized voltage source.

Since the series connection of oscillator and constant current source is supplied by the stabilized voltage source with a stabilized voltage, the constant current source can produce a constant current with smaller or fewer fluctuations, as a result of which the voltage-controlled oscillator is better decoupled from the electrical effects of other circuit components. Since the constant current source is already supplied with a stabilized voltage, a possibly necessary reference current can in addition be produced at low cost by means of a resistor, which is subjected to a voltage derived from the stabilized voltage of the stabilized voltage source.

The at least one controllable capacitor of the LC oscillator can, for example, be a varactor, but it can also be a field-effect transistor. Furthermore, the voltage-controlled oscillator can be current controlled and comprise a voltage-current converter.

The invention is described in detail in the following on the basis of a preferred embodiment with reference to the appended drawing:

DETAILED DESCRIPTION OF THE INVENTION AND ITS PREFERRED EMBODIMENTS

Figure 1:
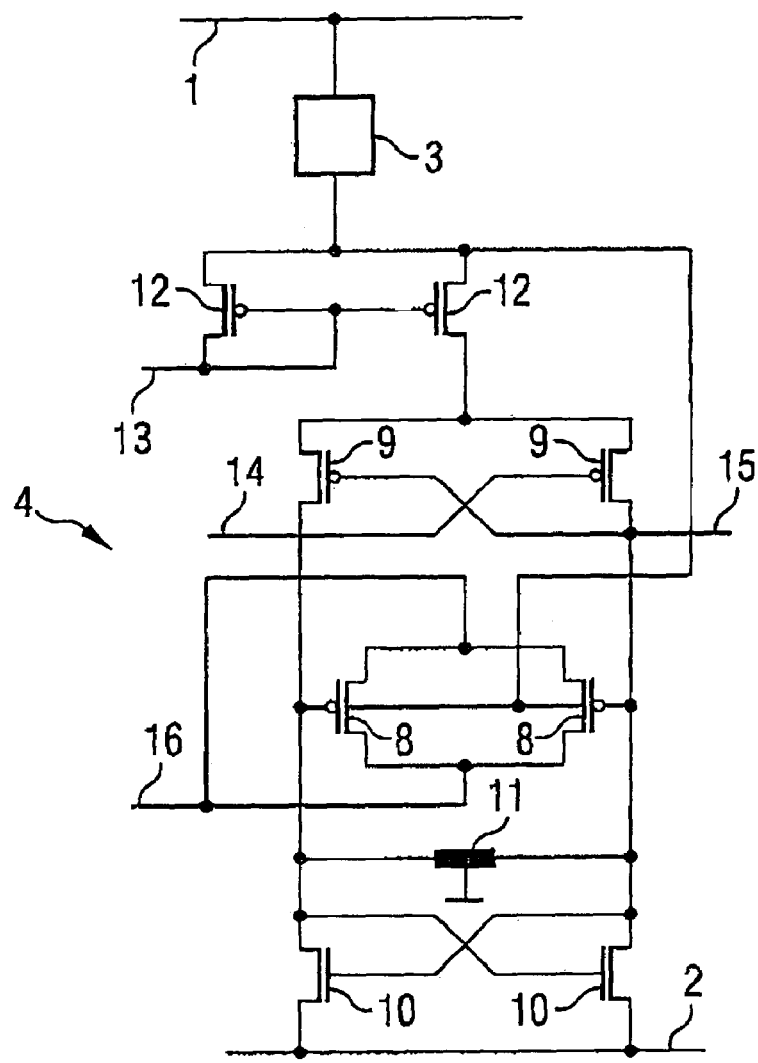
FIG. 1 shows the design of an oscillator circuit with a voltage-controlled oscillator and a schematically-drawn stabilized voltage source in accordance with the embodiment of the present invention.

In FIG. 1, the design of an oscillator circuit with a voltage-controlled LC oscillator 4 is illustrated, whereby the illustrated oscillator circuit together with other circuit components is integrated in a semiconductor. The oscillator circuit is connected to two supply voltage lines 1, 2, to which a supply voltage is applied. Due to the integration of the oscillator circuit with further circuit components in a semiconductor, the two supply voltage lines 1, 2 do not conduct a clean supply voltage, but are subjected to heavy noise or strong disturbances, which are caused by the further circuit components and, due to integration in the semiconductor, can only be poorly suppressed.

The oscillator circuit therefore comprises a stabilized voltage source 3, which is positioned between the positive supply voltage line 1 and the voltage-controlled LC oscillator 8–11, which again is connected to the negative supply voltage line 2.

The voltage-controlled LC oscillator is formed by two NMOS transistors 10, two PMOS transistors 9 as well as an inductor 11 connected in parallel with two voltage-controlled capacitors 8 connected in series. The voltage controlled capacitors 8 are formed by two PMOS transistors, whereby the source terminals and the drain terminals are in each case connected to one another and the two gate terminals to the ends of the inductor 11. The two PMOS transistors 8 possess an N well, which is connected to a positive voltage. The capacity of the two PMOS transistors 8 is controlled by the voltage on a frequency control line 16, which is connected both to the interconnected drain terminals and the interconnected source terminals of the two PMOS transistors 8. The LC oscillator 8–11 possesses two complementary output lines 14, 15, each of which are connected with one of the two ends of the parallel circuit of the inductor 11 with the series circuit of the two capacitors 8.

Furthermore, the LC oscillator circuit includes a constant current source 12, which is formed by a current mirror with two PMOS transistors. The constant current source 12 is arranged so that it subjects the voltage-controlled LC oscillator 8–11 to a constant current, which corresponds to a reference current injected into a current control line 13 of the constant current source 12. The reference current to be injected into the current control line 13 can be produced in a known way by means of a constant current source.

Figure 2:
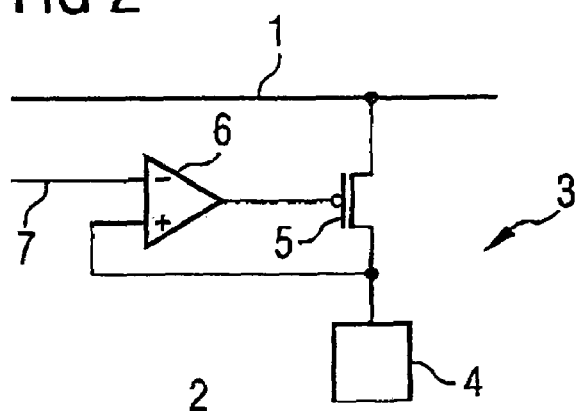
FIG. 2 shows the design of the oscillator circuit according to FIG. 1 with a schematically-drawn voltage-controlled oscillator.

FIG. 2 shows in detail the stabilized voltage source 3, which is formed by a driver, that is subjected to a constant reference voltage on a voltage control line 7. The driver is formed by an operational amplifier 6 with a driver transistor 5. The driver transistor 5 is a PMOS transistor, the gate of which is controlled by the output of the operational amplifier 6. The terminal of the driver transistor 5 connected to the LC oscillator 4 is fed back to the positive input of the operational amplifier 6, so that the LC oscillator 4 is subjected to a stabilized voltage, which corresponds to the reference voltage on the voltage control line 7.

The use according to the invention of a stabilized voltage source supply of a voltage-controlled LC oscillator is not limited to the LC oscillator described in the exemplary embodiment. The advantages according to the invention arise in the case of generally any arrangement of a voltage-controlled oscillator with an inductor to which a controllable capacitor is assigned.

The invention claimed is:

1. Oscillator circuit with a voltage-controlled oscillator, which comprises at least one controllable capacitor as frequency-affecting element and at least one inductor assigned to the controllable capacitor, wherein the voltage-controlled oscillator is connected to a stabilized voltage source to supply the voltage-controlled oscillator so the oscillator is directly subjected to the stabilized voltage from the stabilized voltage source, and wherein the oscillator circuit further comprises a constant current source to produce a constant current flowing through the voltage-controlled oscillator, wherein the constant current source comprises a current mirror.

2. Oscillator circuit with a voltage-controlled oscillator, which comprises at least the controllable capacitor as frequency-affecting element and at least one inductor assigned to the controllable capacitor, wherein the voltage-controlled oscillator is connected to a stabilized voltage source to supply the voltage-controlled oscillator so the oscillator is directly subjected to the stabilized voltage from the stabilized voltage source, and wherein the stabilized voltage source comprises a driver with a low impedance output, which supplies the voltage-controlled oscillator, and with an input, which can be subjected to a stabilized voltage, wherein the oscillator circuit comprises a constant current source to produce a constant current flowing through the voltage-controlled oscillator and the constant current source comprises a current mirror.

3. Oscillator circuit according to claim 2, wherein the stabilized voltage source comprises an operational amplifier.

4. Oscillator circuit according to claim 3, wherein the stabilized voltage source comprises a power amplifier positioned after the operational amplifier.

5. Oscillator circuit according to claim 1, wherein the controllable capacitor is a field effect transistor.

6. Oscillator circuit according to claim 1, wherein the controllable capacitor is a varactor.

7. Oscillator circuit according to claim 1, wherein the oscillator circuit with further circuit components is integrated in a semiconductor.

8. Oscillator circuit according to claim 1, wherein the stabilized voltage source comprises a driver with a low impedance output, which supplies the voltage-controlled oscillator, and with an input, which can be subjected to a stabilized voltage.

9. Oscillator circuit according to claim 8, wherein the stabilized voltage source comprises an oscillator amplifier.

10. Oscillator circuit according to claim 9, wherein the stabilized voltage source comprises a power amplifier positioned after the operational amplifier.

11. Oscillator circuit according to claim 2, wherein the controllable capacitor is a field effect transistor.

12. Oscillator circuit according to claim 2, wherein the controllable capacitor is a varactor.

13. Oscillator circuit according to claim 2, wherein the oscillator circuit with further circuit components is integrated in a semiconductor.

14. Oscillator circuit with a voltage-controlled oscillator, which comprises at least one controllable capacitor as frequency-affecting element and at least one inductor assigned to the controllable capacitor, wherein the voltage-controlled oscillator is connected to a stabilized voltage source to supply the voltage-controlled oscillator, and wherein the oscillator circuit further comprises a constant current source to produce a constant current flowing through the voltage-controlled oscillator, wherein the constant current source comprises a current mirror.

15. Oscillator circuit according to claim 14, wherein the controllable capacitor is a field effect transistor.

16. Oscillator circuit according to claim 14, wherein the controllable capacitor is a varactor.

17. Oscillator circuit according to claim 14, wherein the oscillator circuit with further circuit components is integrated in a semiconductor.

18. Oscillator circuit according to claim 14, wherein the stabilized voltage source comprises a driver with a low impedance output, which supplies the voltage-controlled oscillator, and with an input, which can be subjected to a stabilized voltage.

19. Oscillator circuit according to claim 18, wherein the stabilized voltage source comprises an operational amplifier.

20. Oscillator circuit according to claim 19, wherein the stabilized voltage source comprises a power amplifier positioned after the operational amplifier.

21. Oscillator circuit with a voltage-controlled oscillator, which comprises at least one controllable capacitor as frequency-affecting element and at least one inductor assigned to the controllable capacitor, wherein the voltage-controlled oscillator is connected to a stabilized voltage source to supply the voltage-controlled oscillator, and wherein the stabilized voltage source comprises a driver with a low impedance output, which supplies the voltage-controlled oscillator, and with an input, which can be subjected to a stabilized voltage, wherein the oscillator circuit comprises a constant current source to produce a constant current flowing through the voltage-controlled oscillator and the constant current source comprises a current mirror.

22. Oscillator circuit according to claim 21, wherein the stabilized voltage source comprises an operational amplifier.

23. Oscillator circuit according to claim 22, wherein the stabilized voltage source comprises a power amplifier positioned after the operational amplifier.

24. Oscillator circuit according to claim 21, wherein the controllable capacitor is a field effect transistor.

25. Oscillator circuit according to claim 21, wherein the controllable capacitor is a varactor.

26. Oscillator circuit according to claim 21, wherein the oscillator circuit with further circuit components is integrated in a semiconductor.

27. Oscillator circuit with a voltage-controlled oscillator, which comprises at least one controllable capacitor as frequency-affecting element and at least one inductor assigned to the controllable capacitor, wherein the voltage-controlled oscillator is connected to a stabilized voltage source to supply the voltage-controlled oscillator, wherein the oscillator circuit further comprises a constant current source, wherein a current control line drives the constant current source so the constant current source produces a constant current flowing through the voltage-controlled oscillator, and wherein the stabilized voltage from the stabilized voltage source is applied to an N well of the capacitor.

* * * * *